(12) United States Patent
Holloway et al.

(10) Patent No.: US 11,735,879 B2
(45) Date of Patent: Aug. 22, 2023

(54) ADAPTOR FOR CONVERTING A BALL GRID ARRAY INTERFACE INTO A PIN INTERFACE

(71) Applicant: ATL Technology, LLC, Springville, UT (US)

(72) Inventors: John Carl Holloway, Fort Myers, FL (US); Bradford James Brown, Highland, UT (US); Donovan M. Finnestad, Clackamas, OR (US)

(73) Assignee: ATL TECHNOLOGY, LLC, Springville, UT (US)

( * ) Notice: Subject to any disclaimer, the term of this patent is extended or adjusted under 35 U.S.C. 154(b) by 0 days.

(21) Appl. No.: 17/488,098

(22) Filed: Sep. 28, 2021

(65) Prior Publication Data
US 2022/0294166 A1 Sep. 15, 2022

Related U.S. Application Data

(60) Provisional application No. 63/158,776, filed on Mar. 9, 2021.

(51) Int. Cl.
*H01R 31/06* (2006.01)
*H01R 12/72* (2011.01)
(Continued)

(52) U.S. Cl.
CPC ........... *H01R 31/06* (2013.01); *H01R 12/724* (2013.01); *H01R 12/727* (2013.01); *H01R 13/502* (2013.01); *H01R 2107/00* (2013.01)

(58) Field of Classification Search
CPC ............ H01R 23/7073; H01R 23/7068; H01R 24/28; H01R 31/06; H01R 12/727; H01R 12/724; H01R 2107/00; H01R 13/502
(Continued)

(56) References Cited

U.S. PATENT DOCUMENTS

| | | |
|---|---|---|
| 4,769,906 A | 9/1988 | Purpura et al. |
| 5,090,116 A * | 2/1992 | Henschen .............. H01R 43/16 |
| | | 439/876 |

(Continued)

FOREIGN PATENT DOCUMENTS

| | | |
|---|---|---|
| JP | 2008181817 | 8/2008 |
| JP | 2009170142 | 7/2009 |

(Continued)

*Primary Examiner* — Gary F Paumen
(74) *Attorney, Agent, or Firm* — Kunzler Bean & Adamson

(57) ABSTRACT

An electrical device that comprises a printed circuit board, which has a first mounting surface, a second mounting surface, a mounting edge, and a plurality of mounting pads on the first mounting surface and the second mounting surface, and an electrical component that has a ball grid array. The electrical device further comprises an adaptor, interposed between the mounting edge and the electrical component, and comprising a body, made of an electrically non-conductive material, and a plurality of electrical pins, made of an electrically conductive material and passing at least partially through the body of the adaptor. The first end of each one of the plurality of electrical pins is electrically directly mounted to a corresponding one of the spaced apart solder balls. The second end of each one of the plurality of electrical pins is electrically directly mounted to a corresponding one of the plurality of mounting pads.

20 Claims, 12 Drawing Sheets

(51) Int. Cl.
 *H01R 107/00* (2006.01)
 *H01R 13/502* (2006.01)
(58) Field of Classification Search
 USPC .................................................. 439/79, 692
 See application file for complete search history.

(56) References Cited

U.S. PATENT DOCUMENTS

| | | | |
|---|---|---|---|
| 5,141,445 A * | 8/1992 | Little | H01R 12/57 |
| | | | 439/607.07 |
| 5,281,762 A | 1/1994 | Long et al. | |
| 5,584,708 A * | 12/1996 | Leong | H01R 12/87 |
| | | | 439/79 |
| 5,746,608 A | 5/1998 | Taylor | |
| 5,997,317 A | 12/1999 | Pei et al. | |
| 6,139,336 A | 10/2000 | Olson | |
| 6,247,635 B1 | 6/2001 | Olson | |
| 6,296,496 B1 * | 10/2001 | Trammel | H01R 12/725 |
| | | | 439/79 |
| 6,416,335 B1 * | 7/2002 | Horchler | H01R 12/721 |
| | | | 439/79 |
| 6,454,157 B2 | 9/2002 | Olson | |
| 6,692,273 B1 * | 2/2004 | Korsunsky | H01R 12/725 |
| | | | 439/876 |
| 6,712,632 B2 * | 3/2004 | Wu | H01R 12/7011 |
| | | | 439/328 |
| 6,935,866 B2 | 8/2005 | Kerekes et al. | |
| 6,955,545 B1 | 10/2005 | Morana et al. | |
| 7,118,382 B2 | 10/2006 | Kerekes et al. | |
| 7,357,641 B2 | 4/2008 | Kerekes et al. | |
| 7,607,922 B2 | 10/2009 | Kerekes et al. | |
| 7,794,290 B1 * | 9/2010 | Joffe | H01R 13/6461 |
| | | | 439/692 |
| 8,292,655 B1 | 10/2012 | Ling et al. | |
| 8,677,232 B2 * | 3/2014 | Weeldreyer | G06F 3/04886 |
| | | | 715/788 |
| 8,690,589 B2 * | 4/2014 | Ngo | H01R 12/721 |
| | | | 439/79 |
| 8,834,181 B2 | 9/2014 | Thompson | |
| 10,403,418 B2 | 9/2019 | Aoyagi et al. | |
| 10,510,918 B2 | 12/2019 | Hu et al. | |
| 10,559,903 B2 | 2/2020 | Jiang et al. | |
| 2003/0207600 A1 * | 11/2003 | Ho | H01R 12/725 |
| | | | 439/79 |
| 2015/0056848 A1 * | 2/2015 | Yu | H01R 13/4367 |
| | | | 439/485 |
| 2018/0219310 A1 | 8/2018 | Lukofsky et al. | |

FOREIGN PATENT DOCUMENTS

| | | |
|---|---|---|
| JP | 5871217 | 3/2016 |
| JP | 5962275 | 8/2016 |
| KR | 101318543 | 2/2013 |
| WO | 2009139041 | 11/2009 |

\* cited by examiner

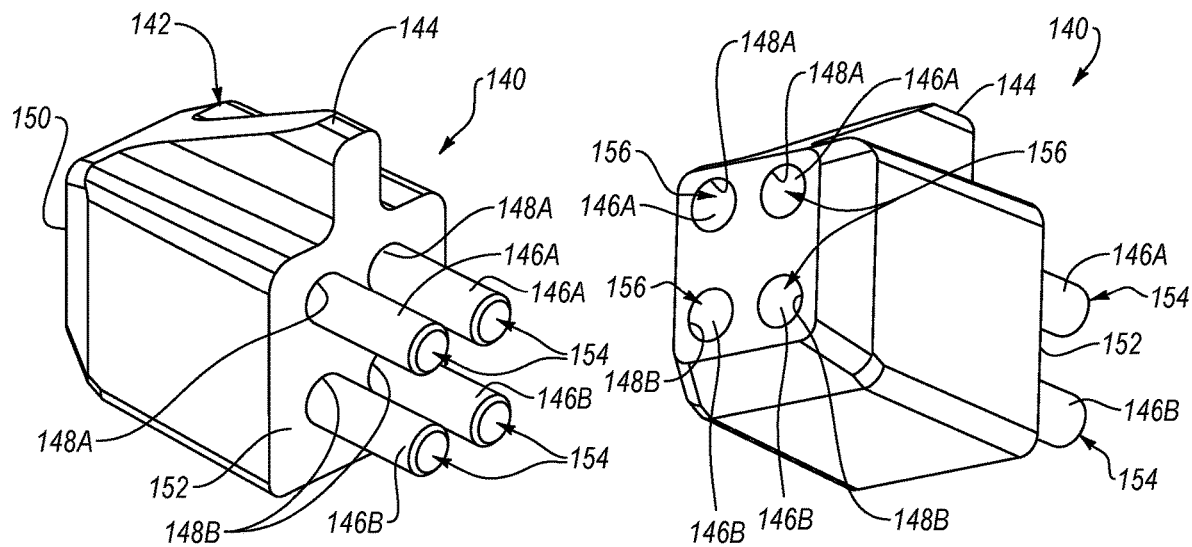
FIG. 3  FIG. 4
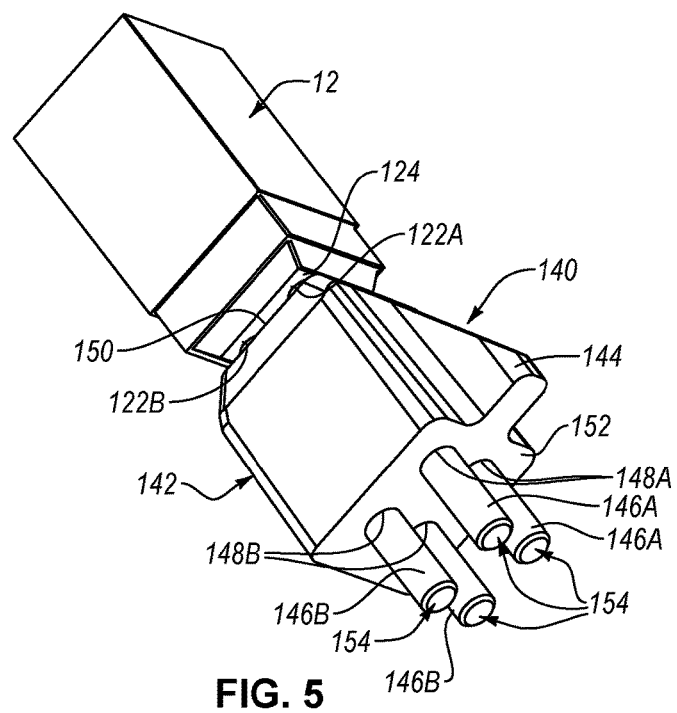
FIG. 5

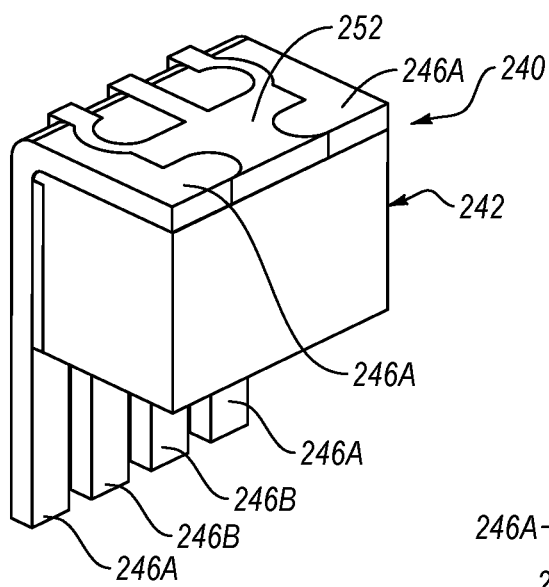
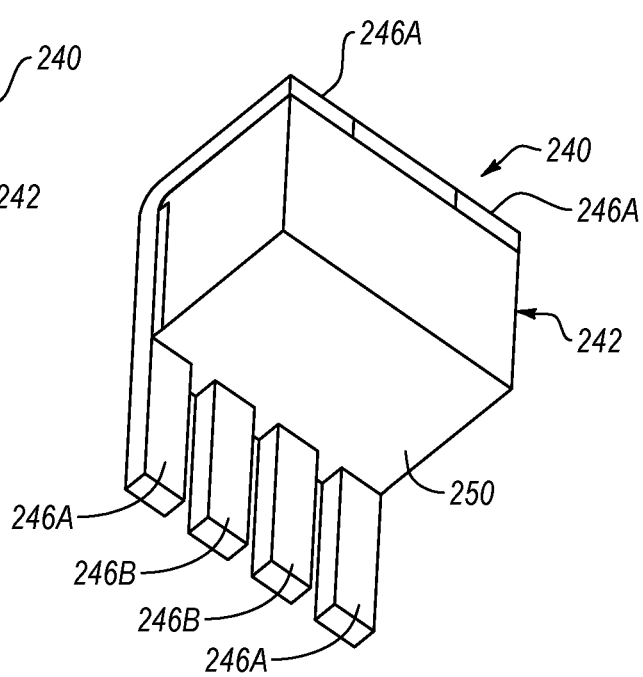
FIG. 10
FIG. 11
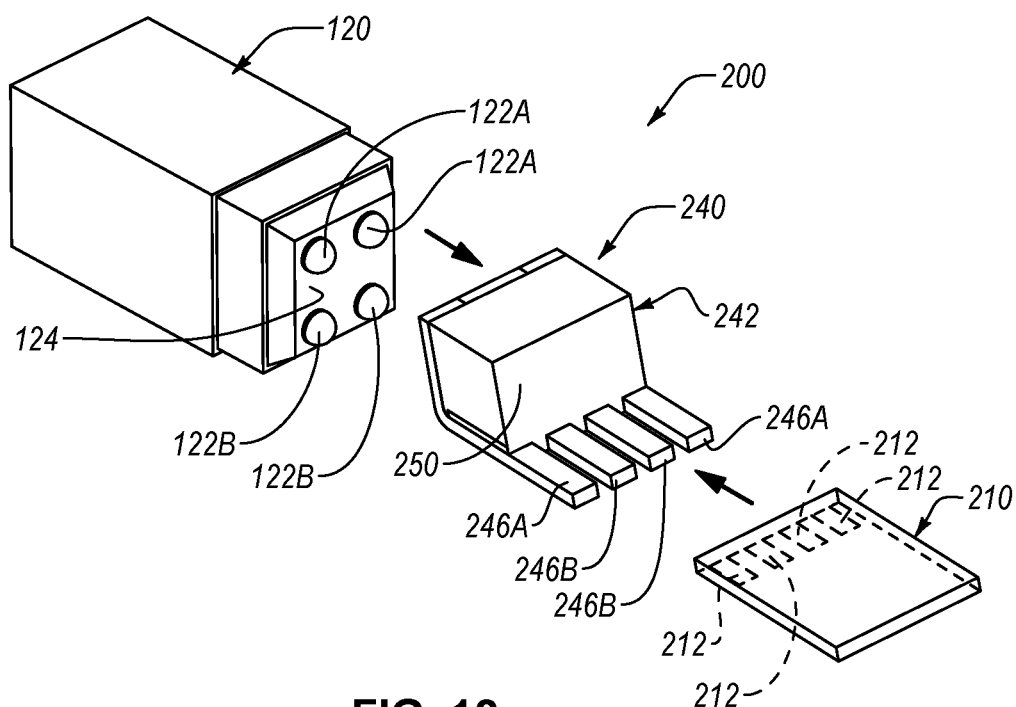
FIG. 12

ADAPTOR FOR CONVERTING A BALL GRID ARRAY INTERFACE INTO A PIN INTERFACE

CROSS-REFERENCE TO RELATED APPLICATION

This application claims the benefit of U.S. Provisional Patent Application No. 63/158,776, filed Mar. 9, 2021, which is incorporated herein by reference.

FIELD

The present disclosure relates generally to electrical devices, and more particularly to mounting electrical components to printed circuit boards of electrical devices.

BACKGROUND

Many electrical devices include electrical components mounted to a printed circuit board. The printed circuit board commonly employs mounting pads, which are configured to conduct electrical signals. Electrical components having a ball-grid array ("BGA") of solder balls can be mounted to the mounting pads using Surface Mount Technology ("SMT") techniques. Typical SMT techniques involve mounting electrical components onto a major surface (e.g., broad surface) of the printed circuit board.

While conventional SMT techniques are appropriate for some electrical devices, for other electrical devices, such as those that demand a streamlined profile, conventional SMT techniques are inadequate. A method of utilizing SMT principles to mount electrical components to a printed circuit board that promotes a low profile of the corresponding electrical device is desirable.

SUMMARY

The subject matter of the present application has been developed in response to the present state of the art, and in particular, in response to the problems and needs of conventional devices or products with surface mount technology that have not yet been fully solved. The subject matter of the present application has been developed to provide an end mount electrical connection to a printed circuit board that overcomes many of the shortcomings of the prior art.

Disclosed herein is an electrical device. The electrical device comprises a printed circuit board that has a first mounting surface, a second mounting surface opposite the first mounting surface, a mounting edge perpendicular to the first mounting surface and the second mounting surface, and a plurality of mounting pads on at least one of the first mounting surface and the second mounting surface. The electrical device also comprises an electrical component that has a ball grid array, having spaced apart solder balls, on a component mounting surface of the electrical component that is perpendicular to the first mounting surface and the second mounting surface. The electrical device further comprises an adaptor that is interposed between the mounting edge of the printed circuit board and the component mounting surface of the electrical component. The adaptor comprises a body, made of an electrically non-conductive material, and a plurality of electrical pins, made of an electrically conductive material and passing at least partially through the body of the adaptor. Each one of the plurality of electrical pins comprises a first end comprising an electrical contact surface and a second end comprising an electrical contact surface. The first end of each one of the plurality of electrical pins is electrically directly mounted to a corresponding one of the spaced apart solder balls. The second end of each one of the plurality of electrical pins is electrically directly mounted to a corresponding one of the plurality of mounting pads. The preceding subject matter of this paragraph characterizes example 1 of the present disclosure.

The electrical device comprises an endoscope. The electrical component comprises a camera. The endoscope comprises a tip assembly that has a tip housing and the adaptor. The camera is positioned within the tip housing. The preceding subject matter of this paragraph characterizes example 2 of the present disclosure, wherein example 2 also includes the subject matter according to example 1, above.

The tip and the adaptor together form a one-piece monolithic construction. The preceding subject matter of this paragraph characterizes example 3 of the present disclosure, wherein example 3 also includes the subject matter according to example 2, above.

The adaptor is electrically and mechanically surface mounted to the electrical component. The adaptor is electrically and mechanically edge mounted to the printed circuit board. The preceding subject matter of this paragraph characterizes example 4 of the present disclosure, wherein example 4 also includes the subject matter according to any one of examples 1-3, above.

The plurality of electrical pins are substantially parallel relative to each other. The preceding subject matter of this paragraph characterizes example 5 of the present disclosure, wherein example 5 also includes the subject matter according to any one of examples 1-4, above.

The body of the adapter comprises an adaptor-mounting surface that faces the electrical component. The first ends of the plurality of electrical pins of the adaptor are flush with the adaptor-mounting surface of the body of the adaptor. The preceding subject matter of this paragraph characterizes example 6 of the present disclosure, wherein example 6 also includes the subject matter according to any one of examples 1-5, above.

The body of the adapter comprises an adaptor-mounting surface that faces the electrical component. The first ends of the plurality of electrical pins of the adaptor protrude from the adaptor-mounting surface of the body of the adaptor. The preceding subject matter of this paragraph characterizes example 7 of the present disclosure, wherein example 7 also includes the subject matter according to any one of examples 1-6, above.

The body of the adaptor further comprises one or more dividers that protrude from adaptor-mounting surface of the body of the adaptor and that separate each one of the first ends of the plurality of electrical pins from any other one of the first ends of the plurality of electrical pins. The preceding subject matter of this paragraph characterizes example 8 of the present disclosure, wherein example 8 also includes the subject matter according to example 7, above.

The electrical contact surfaces of the second ends of the plurality of electrical pins of the adaptor are co-planar and mounted to only one of the first mounting surface or the second mounting surface of the printed circuit board. The preceding subject matter of this paragraph characterizes example 9 of the present disclosure, wherein example 9 also includes the subject matter according to any one of examples 1-8, above.

The electrical contact surfaces of the second ends of a first two of the plurality of electrical pins of the adaptor are co-planar, relative to a first virtual plane, and mounted to only the first mounting surface of the printed circuit board.

The electrical contact surfaces of the second ends of a second two of the plurality of electrical pins of the adaptor are co-planar, relative to a second virtual plane, and mounted to only the second mounting surface of the printed circuit board. The first virtual plane and the second virtual plane are parallel to each other. A distance between the first two of the plurality of electrical pins is different than a distance between the second two of the plurality of electrical pins. The preceding subject matter of this paragraph characterizes example 10 of the present disclosure, wherein example 10 also includes the subject matter according to any one of examples 1-8, above.

Each one of the plurality of electrical pins comprises a 90-degree bend. The first ends and the second ends of each one of the electrical pins are separated by the 90-degree bend. The electrical contact surfaces of the first ends of the plurality of electrical pins of the adaptor are co-planar. The electrical contact surfaces of the first ends are perpendicular relative to the electrical contact surfaces of the second ends. The preceding subject matter of this paragraph characterizes example 11 of the present disclosure, wherein example 11 also includes the subject matter according to any one of examples 1-10, above.

At least one of the plurality of mounting pads is on the first mounting surface. At least one of the plurality of mounting pads is on the second mounting surface. The second end of a first one or first ones of the of the plurality of electrical pins of the adaptor is mounted to a corresponding one of the at least one of the plurality of mounting pads on the first mounting surface. The second end of a second one or second ones of the of the plurality of electrical pins of the adaptor is mounted to a corresponding one of the at least one of the plurality of mounting pads on the second mounting surface. The preceding subject matter of this paragraph characterizes example 12 of the present disclosure, wherein example 12 also includes the subject matter according to any one of examples 1-11, above.

The printed circuit board further comprises a thickness and the first one or first ones of the plurality of electrical pins and the second one or second ones of the plurality of electrical pins are separated by a distance substantially equal to the thickness of the printed circuit board. The preceding subject matter of this paragraph characterizes example 13 of the present disclosure, wherein example 13 also includes the subject matter according to example 12, above.

The body of the adaptor further comprises a plurality of channels. Each one of the plurality of channels is circumferentially closed. The plurality of channels are spaced apart from each other. Each one of the plurality of electrical pins pass through a corresponding one of the plurality of channels. The preceding subject matter of this paragraph characterizes example 14 of the present disclosure, wherein example 14 also includes the subject matter according to any one of examples 1-13, above.

The body of the adaptor further comprises a plurality of sides and a protrusion protruding from a single one of the plurality of sides. The preceding subject matter of this paragraph characterizes example 15 of the present disclosure, wherein example 15 also includes the subject matter according to any one of examples 1-14, above.

Further disclosed herein is a tip assembly for an endoscope. The tip assembly comprises a tip housing and an adaptor. The adaptor comprises a body, made of an electrically non-conductive material and forming a one-piece monolithic construction with the tip housing, and a plurality of electrical pins, made of an electrically conductive material and passing through the body of the adaptor. The preceding subject matter of this paragraph characterizes example 16 of the present disclosure.

The tip assembly further comprises one or more wings coupling together the tip housing and the adaptor such that the adaptor is aligned with the tip housing and does not move relative to the tip housing. The one or more wings form a one-piece monolithic construction with the tip housing and the adaptor. The preceding subject matter of this paragraph characterizes example 17 of the present disclosure, wherein example 17 also includes the subject matter according to example 16, above.

Additionally disclosed herein is a method of making an electrical device. The method comprises a step of soldering a plurality of solder balls of an electrical component to a plurality of electrical pins of an adaptor. The adaptor comprises a body, made of an electrically non-conductive material, and the electrical pins at least partially pass through the body. The method further comprises a step of edge mounting the adaptor to an edge of a printed circuit board, comprising mounting pads on at least one of two opposing mounting surfaces of the printed circuit board, by electrically mounting the electrical pins of the adapter onto the mounting pads of the printed circuit board. The two opposing mounting surfaces of the printed circuit board are perpendicular relative to the edge of the printed circuit board. The preceding subject matter of this paragraph characterizes example 18 of the present disclosure.

The method further comprises a step of, prior to one or more of the steps of soldering the plurality of solder balls to the plurality of electrical pins and edge mounting the adaptor to the edge of the printed circuit board, orienting the plurality of electrical pins using a break-away handle attached to the body of the adaptor to one or more of the plurality of solder balls and the edge of the printed circuit board. The method additionally comprises a step of, subsequent to the steps of soldering the plurality of solder balls to the plurality of electrical pins and edge mounting the adaptor to the edge of the printed circuit board, breaking the break-away handle from the body of the adaptor using a pre-determined directional force. The preceding subject matter of this paragraph characterizes example 19 of the present disclosure, wherein example 19 also includes the subject matter according to example 18, above.

The method comprises a step of, prior to the steps of soldering the plurality of solder balls to the plurality of electrical pins and edge mounting the adaptor to the edge of the printed circuit board, co-stamping a plurality of groups of electrical pins and one or more stamped strips. The second ends of the electrical pins are connected to the one or more stamped strips at break-away interfaces. The method also comprises a step of, prior to the steps of soldering the plurality of solder balls to the plurality of electrical pins and edge mounting the adaptor to the edge of the printed circuit board, co-forming a plurality of electrically non-conductive bodies around each group of electrical pins. At least a portion of the first ends of the electrical pins and second ends of the electrical pins remain exposed. The method also comprises a step of, prior to the steps of soldering the plurality of solder balls to the plurality of electrical pins and edge mounting the adaptor to the edge of the printed circuit board, breaking the groups of electrical pins away from the stamped strips at the break-away interfaces to form a plurality of adapters. The adapter is one of the plurality of adapters. The preceding subject matter of this paragraph characterizes example 20 of the present disclosure, wherein example 20 also includes the subject matter according to any one of examples 18-19, above.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which:

FIG. 3 is a schematic, perspective view of an adaptor of the electrical device of FIG. 1, according to one or more examples of the present disclosure;

FIG. 4 is a schematic, perspective view of the adaptor of FIG. 3, according to one or more examples of the present disclosure;

FIG. 5 is a schematic, perspective view of an electrical component and the adaptor of FIG. 3, according to one or more examples of the present disclosure;

FIG. 10 is a schematic, perspective view of an adaptor, according to one or more examples of the present disclosure;

FIG. 11 is a schematic, perspective view of the adaptor of FIG. 10, according to one or more examples of the present disclosure;

FIG. 12 is a schematic, perspective view of an electrical component and the adaptor of FIG. 10, according to one or more examples of the present disclosure;

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
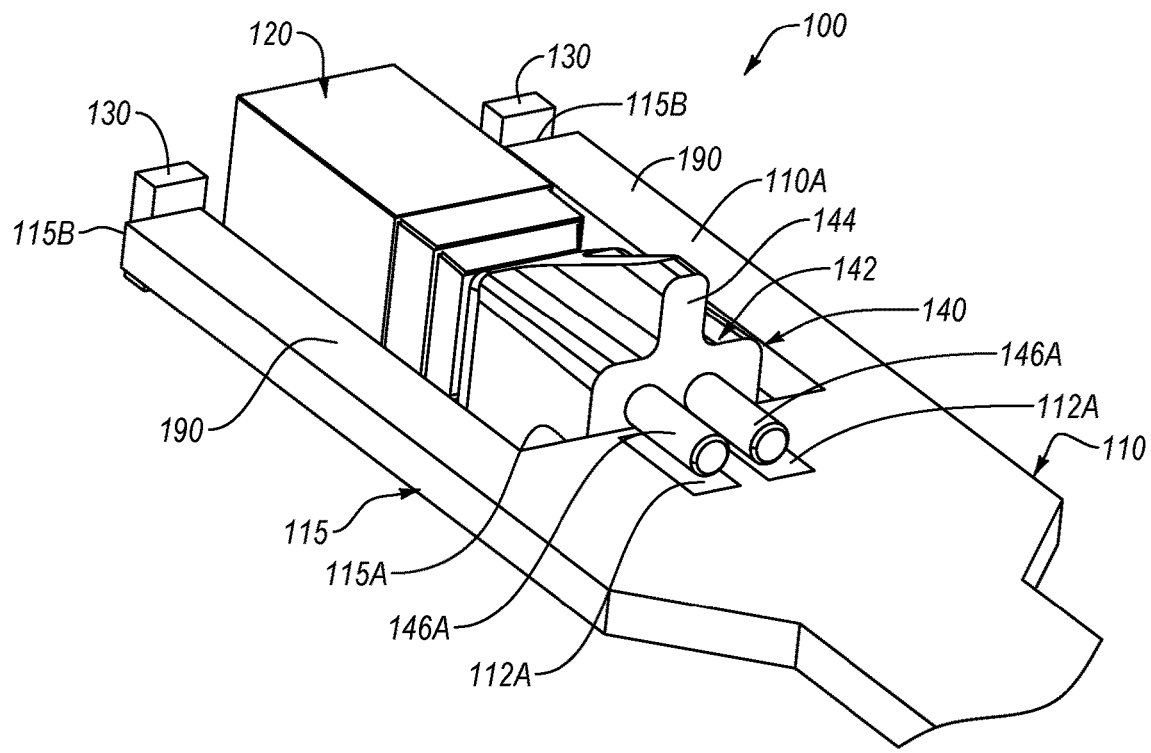
FIG. 1 is a schematic, perspective view of an electrical device, according to one or more examples of the present disclosure.
Figure 2:
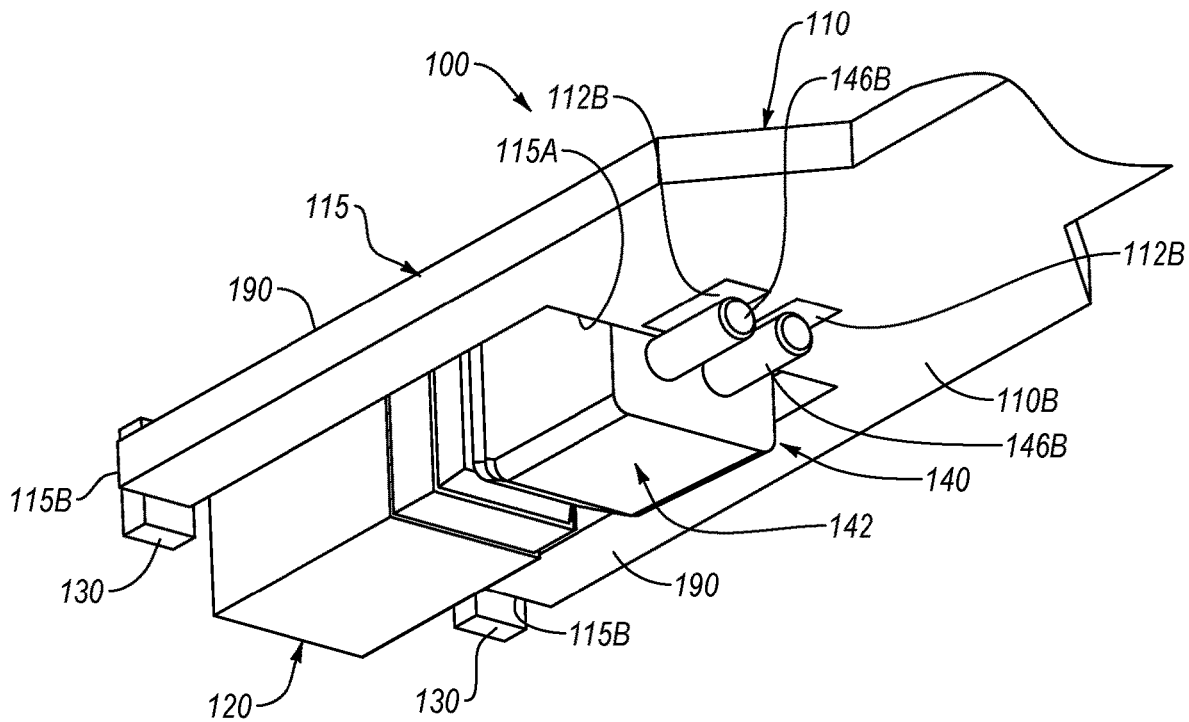
FIG. 2 is a schematic, perspective view of the electrical device of FIG. 1, according to one or more examples of the present disclosure.

Referring to FIGS. 1 and 2, one example of an electrical device 100 is shown. The electrical device 100 includes a circuit board 110, which is a flexible circuit board in some examples, or a semi-rigid or rigid circuit board in other examples. The circuit board 110 includes a first mounting surface 110A, on one side of the circuit board 110, a second mounting surface 110B, on an opposite side of the circuit board 110. A thickness of the circuit board 110 is located between the first mounting surface 110A and the second mounting surface 110B. The thickness defines an outer peripheral edge 115 of the circuit board 110, which extends about an entire periphery of the first mounting surface 110A and the second mounting surface 110B. The circuit board 110 further includes first mounting pads 112A, on the first mounting surface 110A, and second mounting pads 112B, on the second mounting surface 110B. In some examples, the first mounting pads 112A and the second mounting pads 112B are located at and extend from a first mounting edge 115A of the outer peripheral edge 115. The first mounting pads 112A and the second mounting pads 112B are configured to conduct electrical signals.

A normal mounting procedure for a ball grid array ("BGA") employs Surface Mount Technology ("SMT"). As the name implies, SMT is utilized to mount components, in a "surface-to-surface" manner, to a circuit board, as opposed to through-hole technology, which utilized pin-grid arrays ("PGA"). In addition to electrical components with BGA mounting, SMT is utilized for connecting LED's, resistors, capacitors, ICs and nearly all small electrical components in use today.

The electrical device 100 additionally includes an electrical component 120, which is a camera in some examples as further described below, but can be any of various electrical components. The electrical component 120 includes a BGA of solder balls, such as first solder balls 122A and second solder balls 122B (see, e.g., FIG. 12), arranged on a component mounting surface 124 of the electrical component 120. Accordingly, the electrical component 120 is configured to be electrically coupled to a circuit board by positioning the first solder balls 122A and the second solder balls 122B on corresponding mounting pads of the circuit board. The first solder balls 122A and the second solder balls 122B would then be reflowed to establish a permanent electrical and structural connection between electrical component 120 and the circuit board.

In conventional SMT mounting techniques, all the mounting pads are on the same mounting surface of the circuit board such that the component mounting surface 124 (i.e., the surface having the solder balls) is parallel to and mated with a single mounting surface (e.g., broad surface) of the circuit board. As shown in FIGS. 1 and 2, the circuit board 110 includes two major surfaces, the first mounting surface 110A and the second mounting surface 110B. The outer peripheral edge of the circuit board 110 also includes multiple edges that can be utilized as mounting edges or minor surfaces. For example, in addition to the mounting edge 115A, the circuit board 110 can also include two supplemental mounting edges 115B to which supplemental electrical components 130 (e.g., LED lights) can be mounted as shown. The mounting edges of the circuit board 110 are typically small in comparison to the mounting surfaces of the circuit board 110. Generally, mounting edges have a width equal to or no more than the thickness of the circuit board 110. Moreover, the outer peripheral edge 115, and thus the mounting edges, of the circuit board 110 are perpendicular to the first mounting surface 110A and the second mounting surface 110B. For some electrical components having multiple (e.g., four) possible component mounting surfaces and mounting orientations, regardless of which one of the component mounting surfaces is mounted to the mounting surface of the circuit board 110, in conventional techniques, that component mounting surface is parallel to the mounting surface of the circuit board 110. However, as explained in more detail below, in some examples, the present disclosure enables the component mounting surface of the electrical component to be perpendicular to the mounting surface(s) of the circuit board 110 (e.g., end mount or edge mount) when mounted to the circuit board 110, such as to facilitate a more streamlined or lower vertical profile.

The electrical device 100 utilizes an end mount technique to couple the electrical component 120 to the mounting edge 115A of the printed circuit board 110. The supplemental electrical components 130 are end mounted to one of the two supplemental mounting edges 115B of the printed circuit board 110. The supplemental mounting edges 115B may be formed in a distal end of corresponding ones of spaced apart arms 190 of the printed circuit board 110. The arms 190 extend distally of (e.g., longitudinally offset from) the mounting edge 115A. The electrical component 120 is positioned in the space defined between the arms 190.

The electrical device 100 further includes an adaptor 140 that facilitates coupling of the electrical component 120 to the mounting edge 115A. The adaptor 140 includes a body 142 and a plurality of electrical pins passing through the body 142. Although the adaptor 140 can include any number of electrical pins, in the illustrated examples, the adaptor 140 includes four electrical pins. Moreover, although the electrical pins can be arranged relative to each other in any of various arrangements, in the illustrated examples, the plurality of electrical pins are arranged in pairs of two. For example, as illustrated, the adaptor 140 includes a pair of first electrical pins 146A and a pair of second electrical pins 146B. The pair of first electrical pins 146A are offset from the pair of second electrical pins 146B such that a gap, defined between the pair of first electrical pins 146A and the pair of second electrical pins 146B, is capable of receiving a thickness of the circuit board 110 therebetween. Referring to FIGS. 3-7, the electrical pins of the adaptor 140 pass through and are retained within corresponding ones of a plurality of channels formed in the body 142. The number and arrangement of the plurality of channels correspond with the number and arrangement of the electrical pins. For example, as illustrated, the adaptor 140 includes a pair of first channels 148A, that retain the first electrical pins 146A, and a pair of second channels 148B, that retain the second electrical pins 146B.

The body 142 of the adaptor 140 is made of an electrically-non-conductive material, such as a polymeric material. Moreover, the plurality of channels of the adaptor 140 are circumferentially closed and spaced apart from each other. Accordingly, when retained by the plurality of channels (e.g., the first channels 148A and the second channels 148B), the plurality of electrical pins (e.g., the first electrical pins 146A and the second electrical pins 146B) are electrically isolated from each other by the body 142 of the adaptor 140. The first electrical pins 146A, the second electrical pins 146B, the first channels 148A, and the second channels 148B of the adaptor 140 extend from a first adaptor-mounting surface 150 of the body 142 to a second adaptor-mounting surface 152 of the body 142. Accordingly, the first electrical pins 146A and the second electrical pins 146B are accessible at both the adaptor-mounting surface 150 and the second adaptor-mounting surface 152.

A distance between the first adaptor-mounting surface 150 and the second adaptor-mounting surface 152 defines a length of the body 142. The first electrical pins 146A and the second electrical pins 146B have respective lengths that are parallel with and longer than the length of the body 142. Accordingly, one or both end portions of each one of the first electrical pins 146A and the second electrical pins 146B extends away (e.g., protrudes) from the body 142. In the illustrated examples, a board end portion 154 of each one of the first electrical pins 146A and the second electrical pins 146B extends away from the second adaptor-mounting surface 152 (see, e.g., FIGS. 3-7) in a direction away from the electrical component 120, when the adaptor 140 is coupled with the electrical component 120.

In some examples, as shown in FIGS. 3-5, a component end portion 156, opposite the board end portion 154, of each one of the first electrical pins 146A and the second electrical pins 146B does not extend away from the first adaptor-mounting surface 150, in a direction toward the electrical component 120, when the adaptor 140 is coupled with the electrical component 120. More specifically, the component end portion 156 of each one of the first electrical pins 146A and the second electrical pins 146B is flush with the first adaptor-mounting surface 150. The component end portions 156 of the first electrical pins 146A and the second electrical pins 146B, being flush with the first adaptor-mounting surface 150, enable the electrical component 120 to be mounted as close as possible to the adaptor 140, which can help to reduced an overall size of the electrical device 100. In such an example, the component mounting surface 124 of the electrical component 120 and the first adaptor-mounting surface 150 of the adaptor 140 are separated by no more than a thickness of the first solder balls 122A and the second solder balls 122B.

Figure 6:
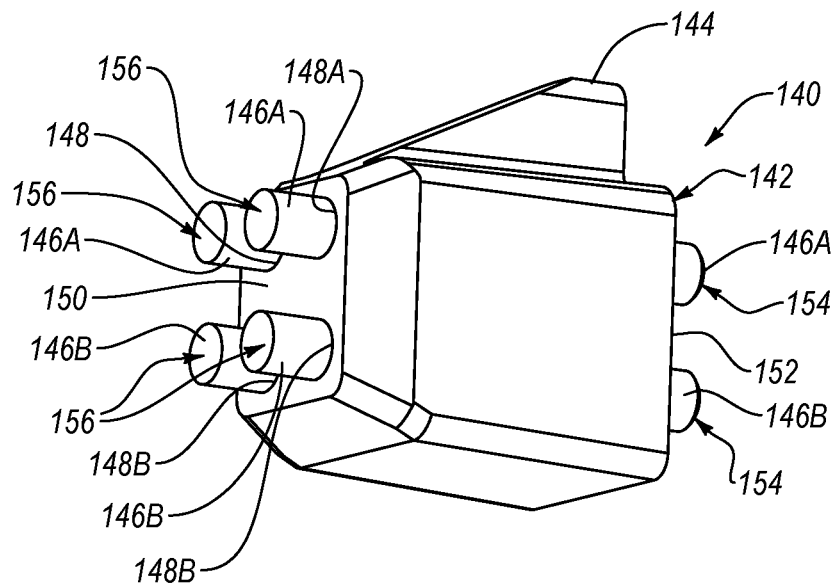
FIG. 6 is a schematic, perspective view of an adaptor, according to one or more examples of the present disclosure.
Figure 7:
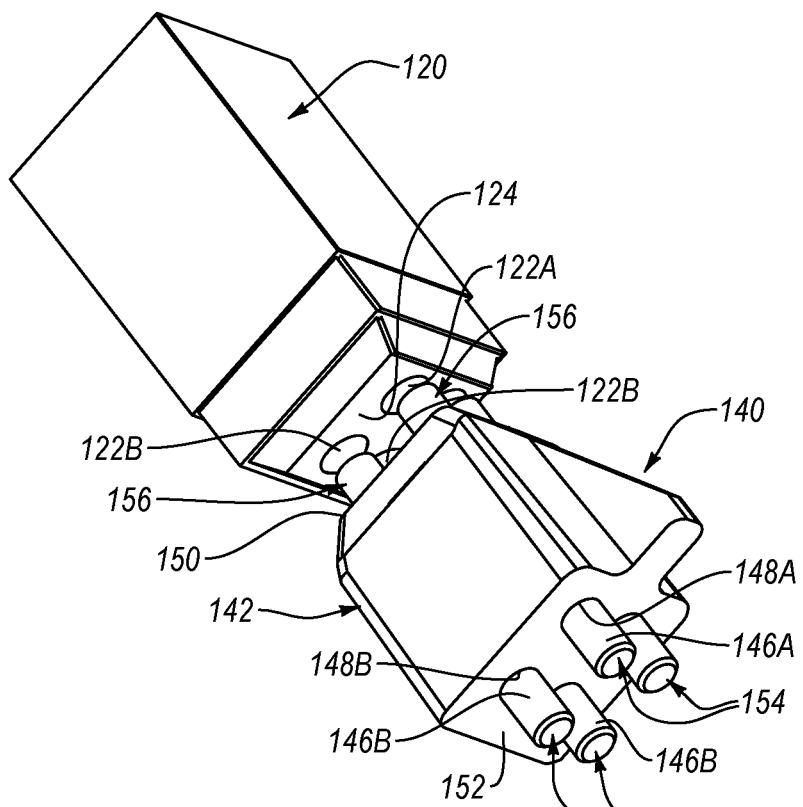
FIG. 7 is a schematic, perspective view of an electrical component and the adaptor of FIG. 6, according to one or more examples of the present disclosure.

However, in some examples, as shown in FIGS. 6 and 7, the electrical component 120 is not mounted as close as possible to the adaptor 140. More specifically, the component end portions 156 of the first electrical pins 146A and the second electrical pins 146B extend away from the first adaptor-mounting surface 150, in a direction toward the electrical component 120, when the adaptor 140 is coupled with the electrical component 120. The extension of the component end portions 156 creates an offset between the component mounting surface 124 of the electrical component 120 and the first adaptor-mounting surface 150 of the adaptor 140. This offset provides a space, between the component mounting surface 124 and the first adaptor-mounting surface 150 sufficient to easily access the interfaces between the first electrical pins 146A, the second electrical pins 146B, the first solder balls 122A, and the second solder balls 122B. The access provided by the offset makes it easier to electrically couple (e.g., solder) the first solder balls 122A and the second solder balls 122B to the first electrical pins 146A and the second electrical pins 146B, respectively, to form the solder joints. Additionally, the access provided by the offset enables soldering by means other than reflowing in an oven, such as by irons, lasers, robotic soldering, and the like. The access also facilitates visual inspection of the solder joints and enables reworking of the solder joints if necessary.

Figure 8:
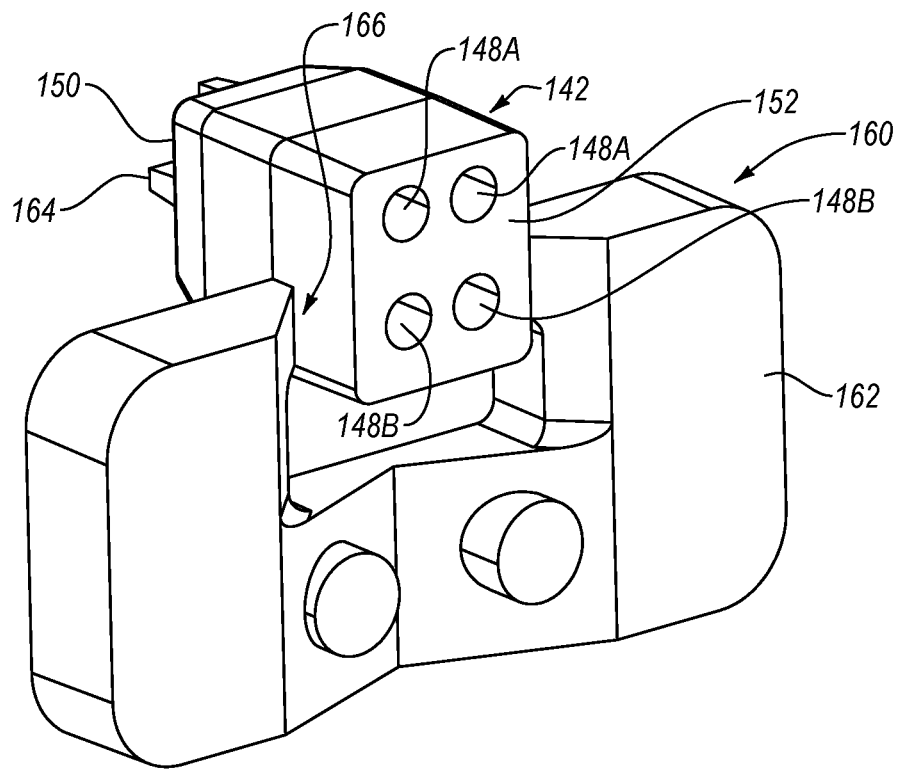
FIG. 8 is a schematic, perspective view of an adaptor and a handle, according to one or more examples of the present disclosure.
Figure 9:
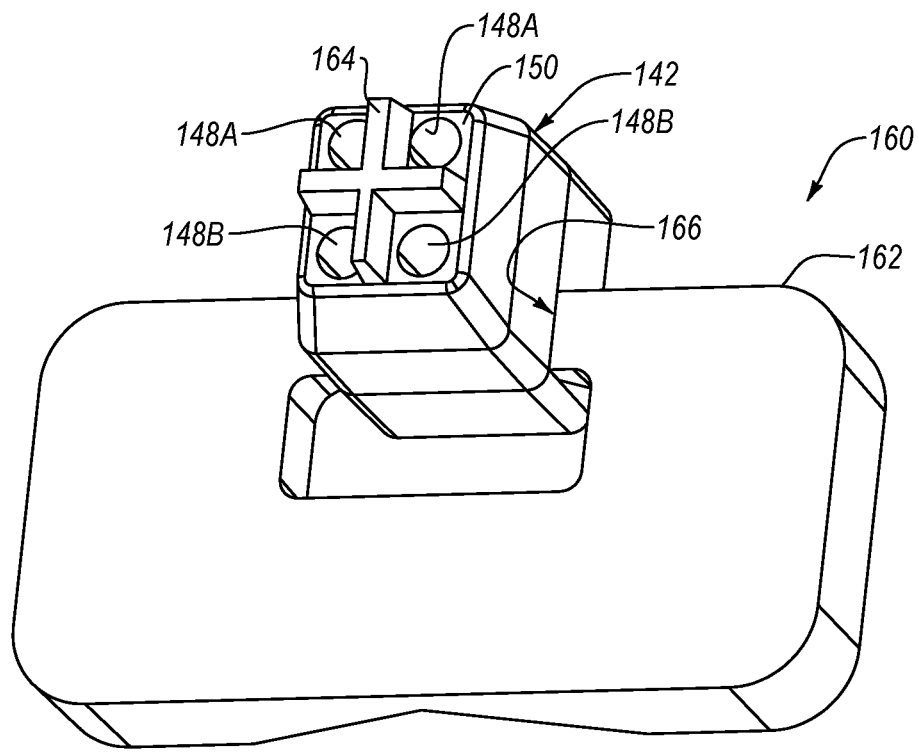
FIG. 9 is a schematic, perspective view of the adaptor and the handle of FIG. 8, according to one or more examples of the present disclosure.

Referring to FIGS. 8 and 9, in some examples, where the component end portions 156 of the first electrical pins 146A and the second electrical pins 146B protrude from the first adaptor-mounting surface 150, the body 142 of the adaptor 140 includes a cruciform 164, or divider, that protrudes from the first adaptor-mounting surface 150 and provides a barrier between adjacent ones of the first channels 148A and the second channels 148B. The barrier provided by the cruciform 164 provides added dielectric value by electrically isolating the first electrical pins 146A and the second electrical pins 146B from each other and helps to reduce heating more than one electrical pin at a time when electrically coupling the electrical pins to the electrical component 120.

To promote a proper orientation of the adaptor 140 relative to the electrical component 120 and the circuit board 110, in some examples, the body 142 includes a protrusion 144. The protrusion 144 is positioned on a particular surface of the body 142 to provide an indication of how the adaptor 140 should be oriented when electrically coupled with the electrical component 120 and/or the circuit board 110. The protrusion 144 can also help with handling of the adaptor 140. In the illustrated example, the protrusion 144 has a fin-like shape, but in other examples, the protrusion 144 can be any of various features that provides visual and/or mechanical asymmetry.

The electrical device 100 is assembled by electrically and mechanically coupling the adaptor 140 to the electrical component 120 and the circuit board 110 such that the adaptor 140 is interposed between the electrical component 120 and the circuit board 110. More specifically, the adaptor 140 is interposed between the electrical component 120 and the mounting edge 115A of the circuit board 110. The order of assembly can vary as desired. In some examples, the electrical component 120 is first electrically and mechanically coupled to the adaptor 140 (see, e.g., FIG. 5). The sub-assembly, including the electrical component 120 and the adaptor 140, is then electrically and mechanically coupled to the circuit board 110. Alternatively, in certain examples, the adaptor 140 is first electrically and mechanically coupled to the circuit board 110. Then, the electrical component 120 is electrically and mechanically coupled to the adaptor 140.

The electrical component 120 is electrically and mechanically coupled to the adaptor 140 using conventional SMT mounting techniques. In other words, the first solder balls 122A and the second solder balls 122B are soldered to the first electrical pins 146A and the second electrical pins 146B on the same side of the adaptor 140, such that the component mounting surface 124 of the electrical component 120 (i.e., the surface having the solder balls) is parallel to the first adaptor-mounting surface 150 when the solder balls are soldered to the electrical pins.

However, the adaptor 140 is electrically and mechanically coupled to the circuit board 110 using an end mount or edge mount technique, such that the second adaptor-mounting surface 152 of the adaptor, as well as the component mounting surface 124 of the electrical component, is orthogonal to the first mounting surface 110A and the second mounting surface 110B of the circuit board 110, and parallel to the mounting edge 115A of the circuit board 110. According to the end mount technique, the mounting edge 115A of the circuit board 110 is positioned between the pair of first electrical pins 146A and the pair of second electrical pins 146B. In other words, the first electrical pins 146A are located on the first mounting pads 112A on the first mounting surface 110A and the second electrical pins 146B are located on the second mounting pads 112B on the second mounting surface 110B. In some embodiments, although other electrical coupling techniques can be used, see examples below, to edge mount the adaptor 140 to the circuit board 110, the first electrical pins 146A are soldered to the first mounting pads 112A on the first mounting surface 110A and the second electrical pins 146B are soldered to the second mounting pads 112B on the second mounting surface 110B. Accordingly, a portion of the circuit board 110 is positioned in the gap and interposed between the first electrical pins 146A and the second electrical pins 146B. The electrical pins can be described as straddling the circuit board 110 across the thickness of the circuit board 110. In view of the foregoing, a single surface of the electrical component 120 is electrically connected to opposite sides of the circuit board 110 (e.g., both the first mounting surface 110A and the second mounting surface 110B) via the adaptor 140.

In some examples, the electrical and mechanical coupling between the solder balls of the electrical component 120 and the electrical pins of the adaptor 140 and the mounting pads of the circuit board 110 and the electrical pins of the adaptor 140 is facilitated by any of various electrical coupling techniques, such as (e.g., soldering, welding, brazing, conductive epoxying, etc.).

The adaptor 140 can be made according to any of various manufacturing processes. According to one example, the body 142 is made via a molding technique, such as injection molding, and the first electrical pins 146A and the second electrical pins 146B are inserted (e.g. press fit) into and retained by the first channels 148A and the second channels 148B after the body 142 is molded. In other examples, the body 142, with the first electrical pins 146A and the second electrical pins 146B fixed in place, is molded around the first electrical pins 146A and the second electrical pins 146B.

Referring to FIGS. 8 and 9, according to some examples, the manufacturing and assembly of the adaptor 140 and the electrical device 100 is facilitated by a handle 162. The handle 162 is co-molded with the body 142 of the adaptor 140 to form an adaptor-handle unit 160. Moreover, the handle 162 is coupled with the body 142 at break-away interfaces 166 between the handle 162 and the body 142. The break-away interfaces 166 are strong enough to keep the body 142 and the handle 162 together during assembly of the electrical device 100, but weak enough to enable the body 142 to break away from the handle 162 under a predetermine force (e.g., twisting force). Accordingly, while the body 142 is coupled to the handle 162 via the break-away interfaces 166, the first electrical pins 146A and the second electrical pins 146B are inserted into the first channels 148A and the second channels 148B, the electrical component 120 is soldered to the electrical pins, and the circuit board 110 is soldered to the electrical pins. The handle 162 helps to secure the body 142 during assembly of the electrical device 100. Thereafter, the body 142 is broken away from the handle 162 and the handle 162 is discarded.

Referring to FIGS. 10-12, according to some alternative examples, an adaptor 240 is shown. The adaptor 240 is configured to provide functionality similar to the adaptor 140 of FIGS. 1-9. More specifically, the adaptor 240 enables the electrical component 120 to be electrically mounted to the adaptor 240, via conventional SMT mounting techniques, but facilitates electrical mounting of the adaptor 240 to a surface of a circuit board 210 that is perpendicular to the component mounting surface 124 of the electrical component 120 (see, e.g., FIG. 12).

The adaptor 240 includes first electrical pins 246A and second electrical pins 246B that are coupled to a body 242 of the adaptor 240. However, instead of cylindrical electrical pins passing through holes in the body 242, the first electrical pins 246A and the second electrical pins 246B have a polygonal cross-sectional shape and are shaped (e.g., bent) about the body 242 from a second adaptor-mounting surface 252 to a first adaptor-mounting surface 250 of the body 242. In some embodiments, the first electrical pins 246A and the second electrical pins 246B are coplanar with and/or shaped about the body 242 using a 90-degree angle. The first electrical pins 246A and the second electrical pins 246B have electrical contact surfaces, at second end portions of the electrical pins, that are flush with the second adaptor-mounting surface 252, and have electrical contact surfaces, at the first end portions of the electrical pins that protrude away from and are perpendicular to the first adaptor-mounting surface 250. In some embodiments, the electrical contact surfaces at the first ends of the first electrical pins 246A and the second electrical pins 246B are perpendicular to the electrical contact surfaces at the second ends of the first electrical pins 246A and the second electrical pins 246B. Moreover, in the examples illustrated in FIGS. 10-12, the first end portions of the electrical pins are co-planar such that they can be mounted (e.g., via an automated interconnect attachment) onto corresponding mounting pads 212 on the same mounting surface of the circuit board 210, or other component, such as ribbon cable, discrete wires, etc. In certain examples, the first electrical pins 246A and the second electrical pins 246B are stamped.

Figure 13:
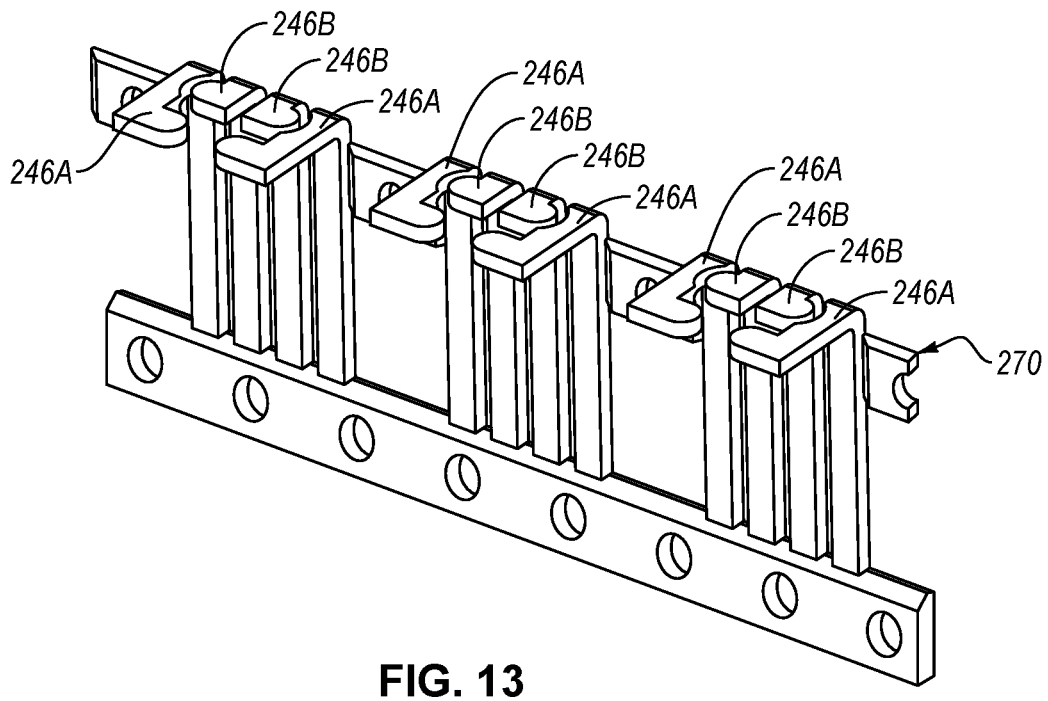
FIG. 13 is a schematic, perspective view of a stamped strip, according to one or more examples of the present disclosure.
Figure 14:
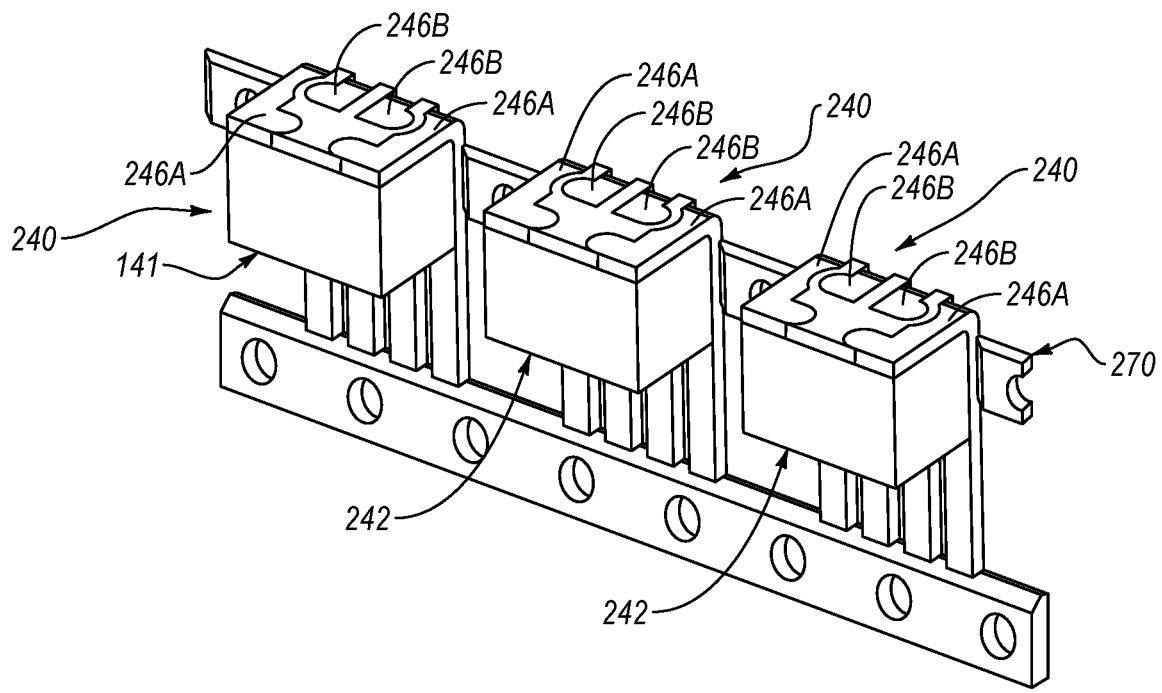
FIG. 14 is a schematic, perspective view of a stamped strip and bodies, according to one or more examples of the present disclosure.

Referring to FIGS. 13 and 14, according to some examples, the manufacturing and assembly of the adaptor 240, and corresponding electrical device 200 (see, e.g., FIG. 12), is facilitated by co-forming (co-stamping) multiple sets of the first electrical pins 246A and the second electrical pins 246B as part of a stamped strip 270. The sets of the first electrical pins 246A and the second electrical pins 246B are connected to the stamped strip 270 at break-away interfaces. In one example, the stamped strip 270 is fed through a reel-to-reel molding press that molds a body 242 of an adaptor 240 to each set of the first electrical pins 246A and the second electrical pins 246B. According to some examples, while connected to the stamped strip 270, electrical components 120 and circuit boards 210 are electrically coupled to corresponding sets of the first electrical pins 246A and the second electrical pins 246B to form separate electrical devices 200. Thereafter, the electrical devices 200 are broken away from the stamped strip 270 along the break-away interfaces.

Figure 15:
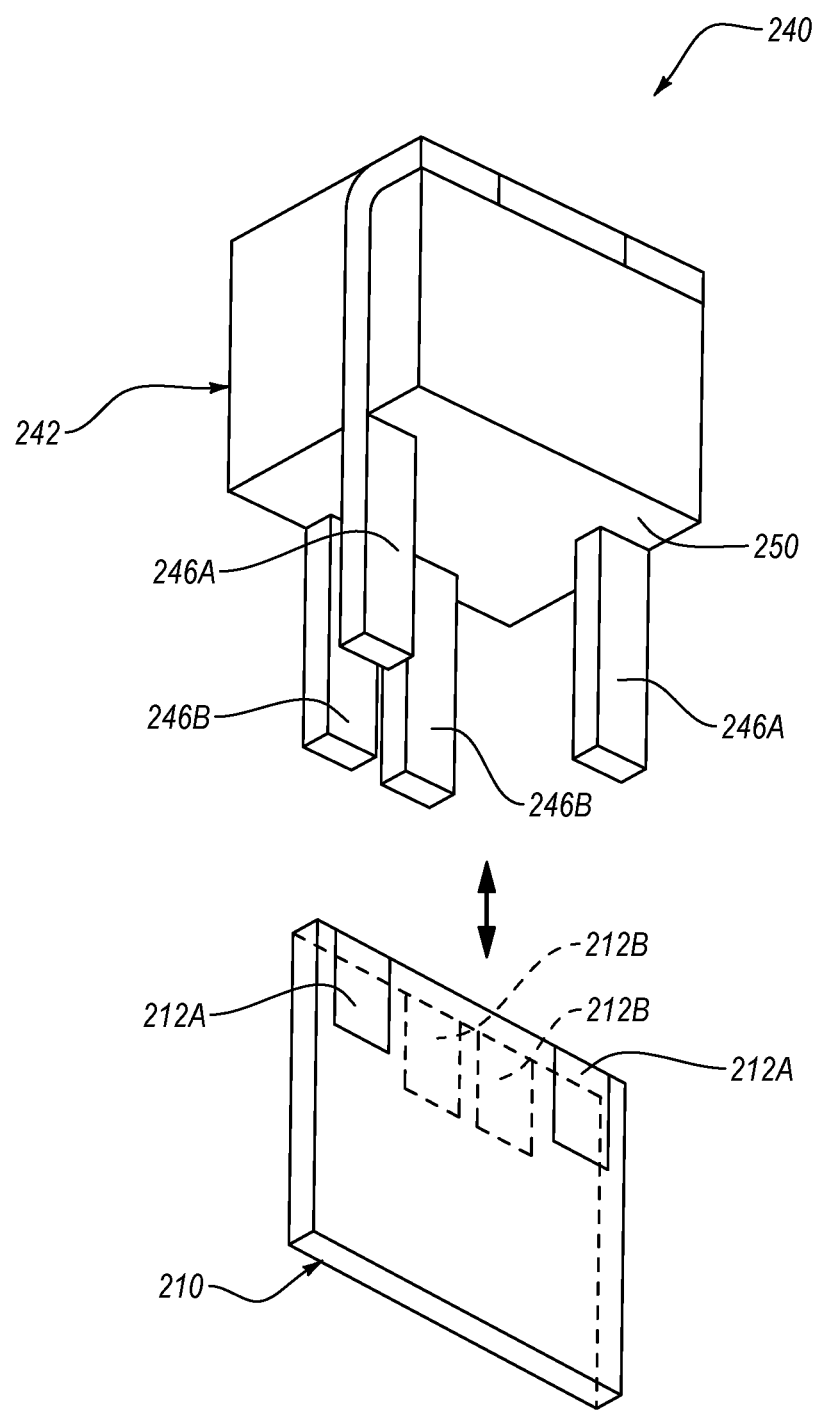
FIG. 15 is a schematic, perspective view of an adaptor, according to one or more examples of the present disclosure.
Figure 16:
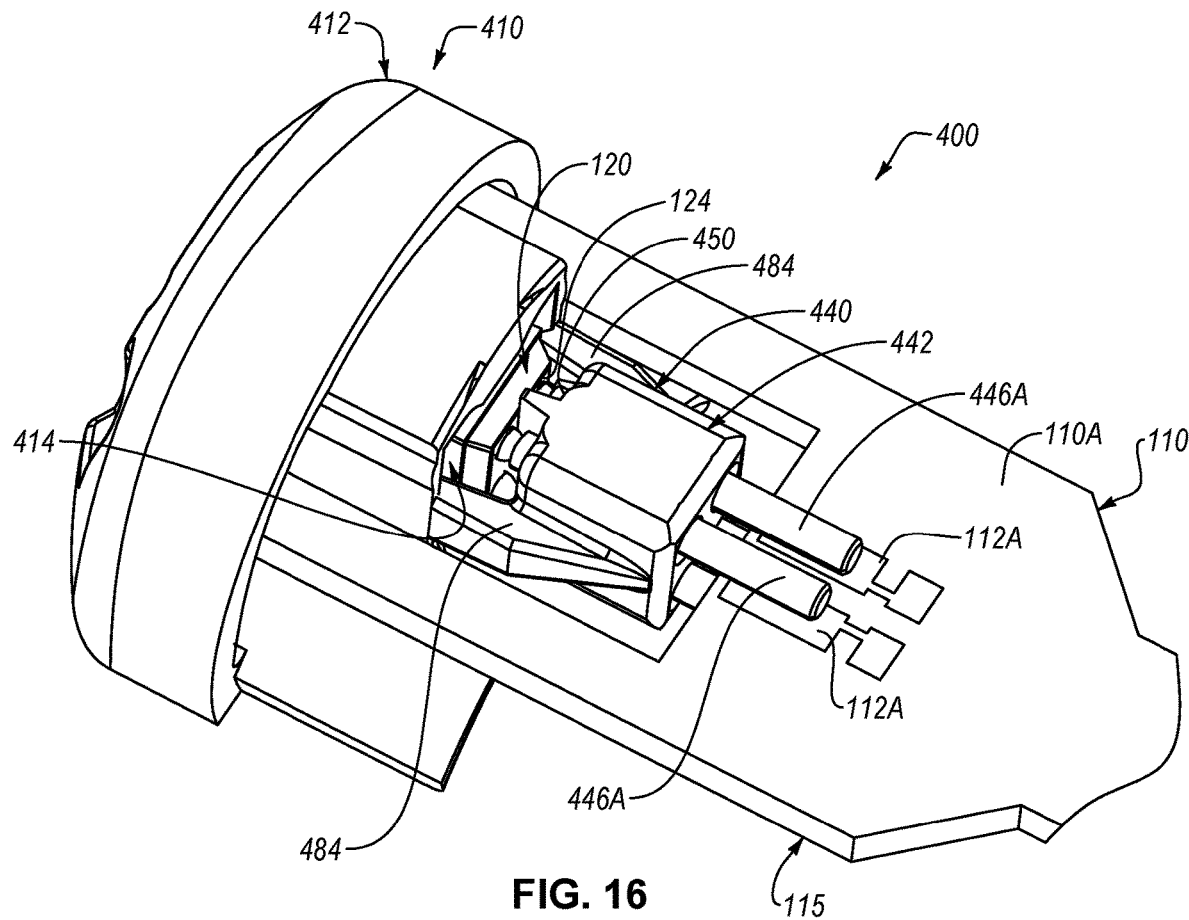
FIG. 16 is a schematic, perspective view of an endoscope, according to one or more examples of the present disclosure.
Figure 17:
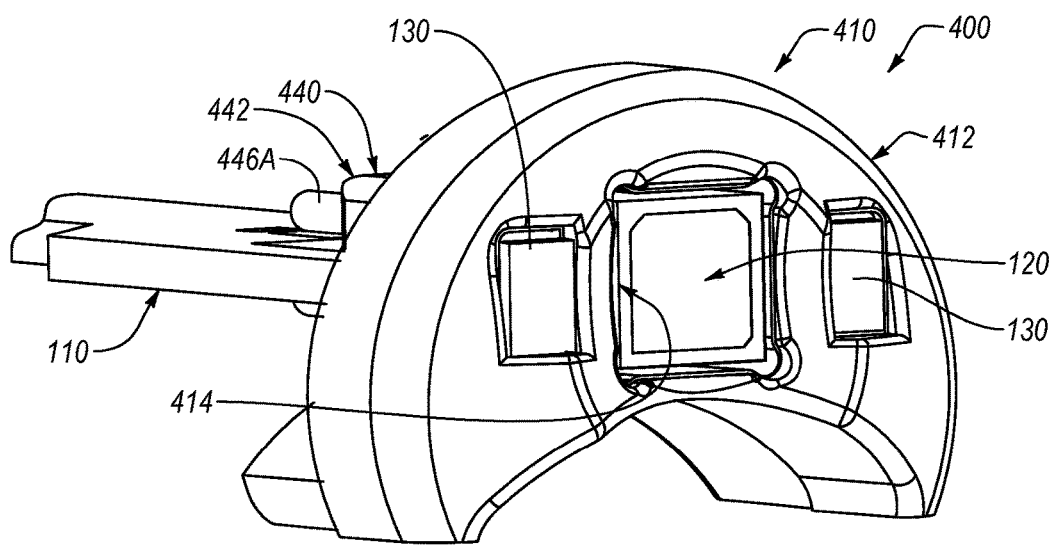
FIG. 17 is a schematic, perspective view of the endoscope of FIG. 16, according to one or more examples of the present disclosure.
Figure 18:
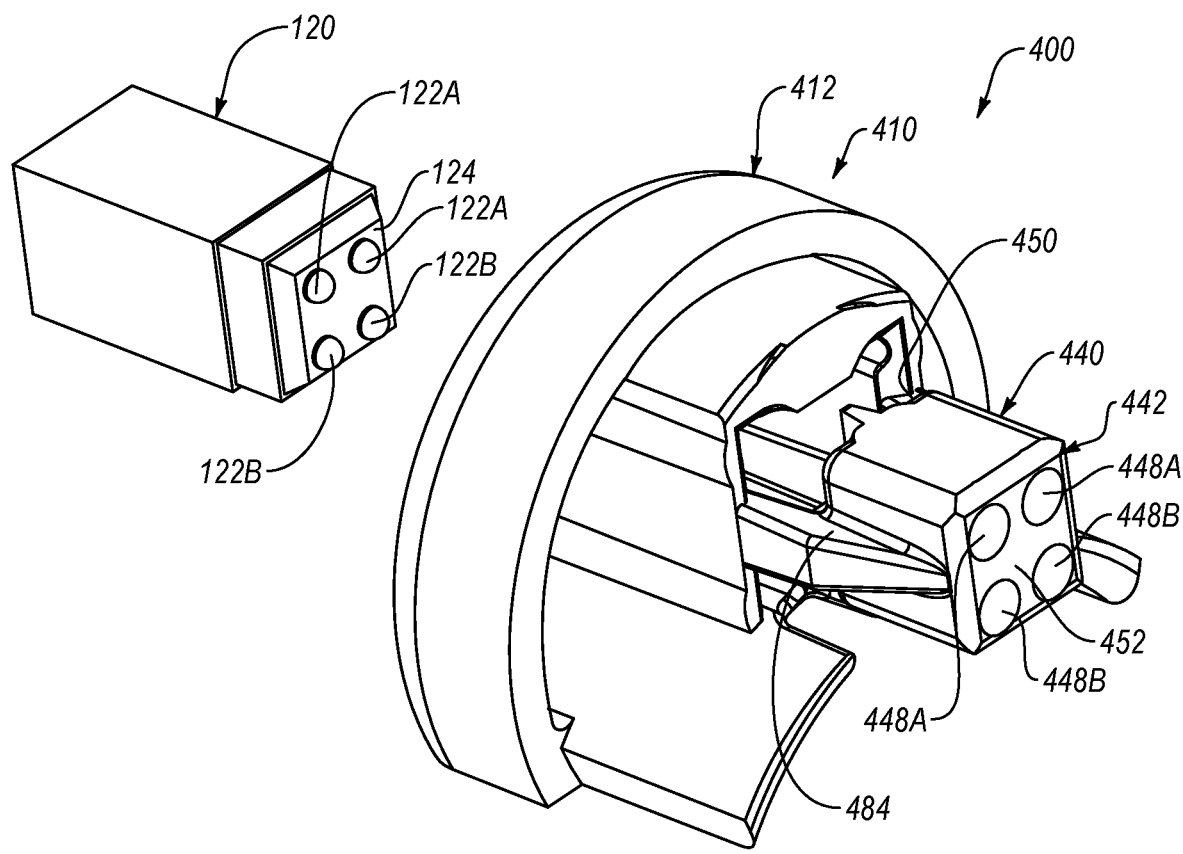
FIG. 18 is a schematic, perspective exploded view of the endoscope of FIG. 16, according to one or more examples of the present disclosure.
Figure 19:
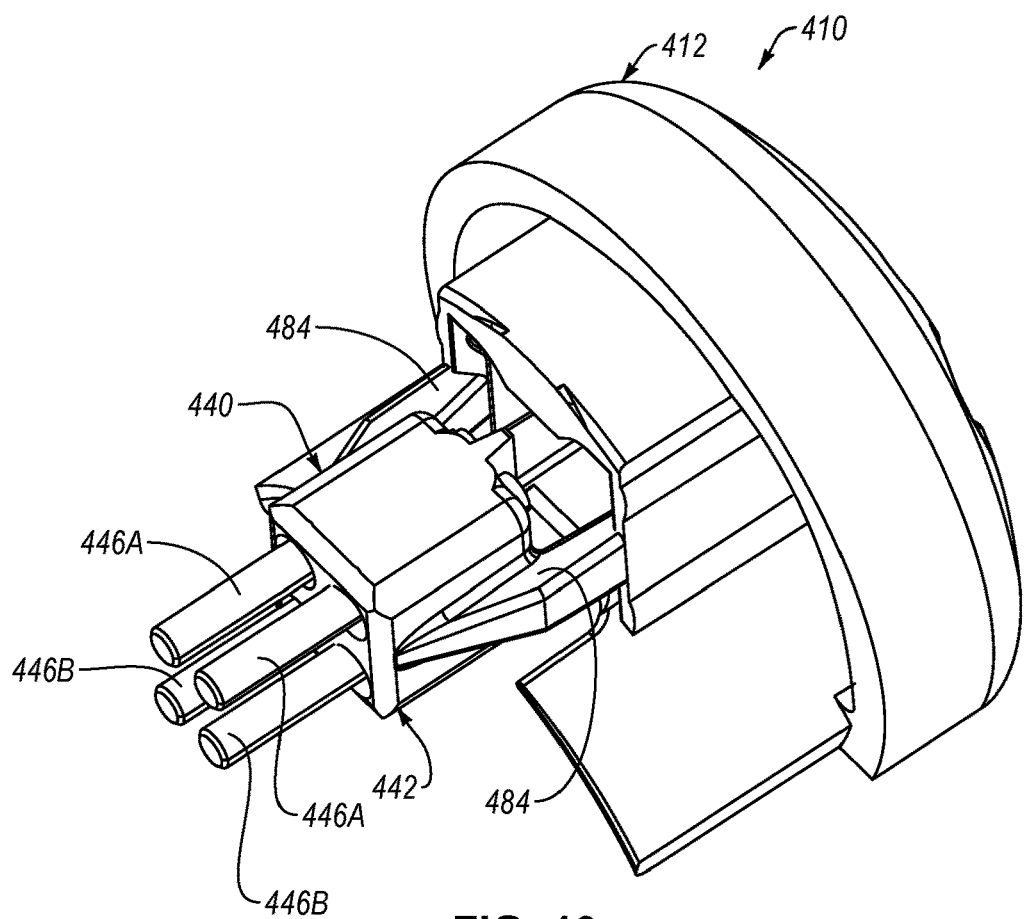
FIG. 19 is a schematic, perspective view of the endoscope of FIG. 16, according to one or more examples of the present disclosure.
Figure 20:
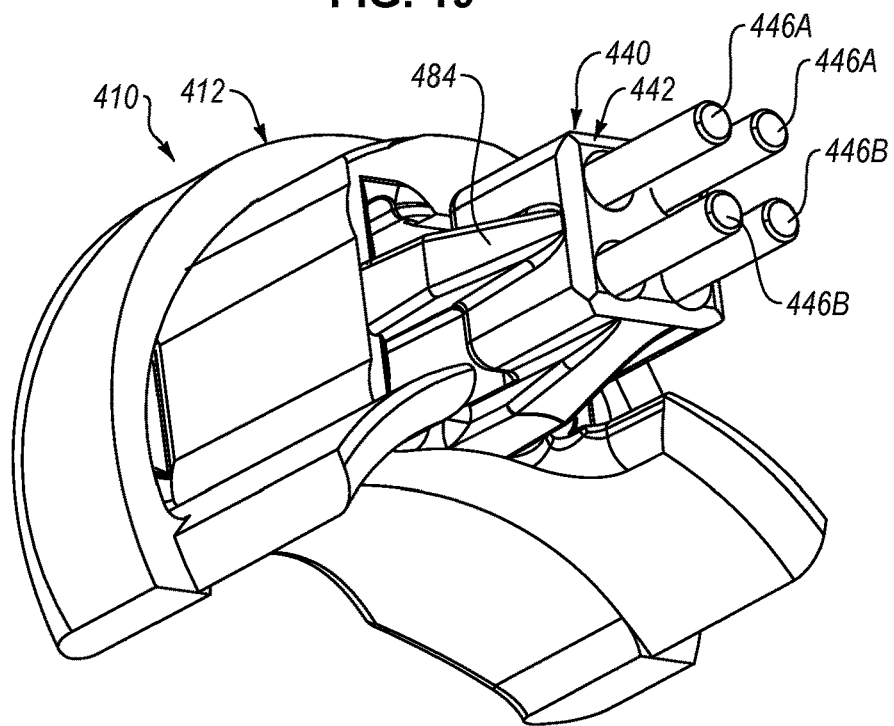
FIG. 20 is a schematic, perspective view of the endoscope of FIG. 16, according to one or more examples of the present disclosure.

Referring to FIG. 15, in alternative examples, although the first electrical pins 246A and the second electrical pins 246B can be stamped, the first end portions of the first electrical pins 246A and the second electrical pins 246B are not co-planar, but are offset relative to each other. Accordingly, like the first electrical pins 146A and the second electrical pins 146B of the adaptor 140, the offset or gap between the first electrical pins 246A and the second electrical pins 246B enables the circuit board 210 to be interposed between the first electrical pins 246A and the second electrical pins 246B. Such an arrangement facilitates the electrical connection of the first electrical pins 246A and the second electrical pins 246B with first mounting pads 212A on one side of the circuit board 210 and second mounting pads 212B on an opposite side of the circuit board 210, respectively, to support end mounting the circuit board 210 to the adaptor 240.

Referring to FIGS. 16-20, according to some examples, the electrical device is an endoscope 400, the electrical component 120 is a camera, and the supplemental electrical components 130 are LED lights. The endoscope 400 includes a tip assembly 410 that integrates a tip housing 412 of the endoscope 400 and an adaptor 440. The tip housing 412 provides a cover or housing in which the electrical component 120 and the supplemental electrical components 130 are positioned. To house the electrical component 120, the tip housing 412 includes a receptacle 414 that has a substantially similar cross-sectional shape as the electrical component 120. The receptacle 414 receives and retains the electrical component 120 via a slip fit, a press fit, or the like. The tip housing 412 defines a leading end surface of the endoscope 400. The adaptor 440, which includes features similar to the adaptor 140 described above, is co-formed with the tip housing 412 such that the tip assembly 410, including the tip housing 412 and the adaptor 440, has a one-piece monolithic construction. Such a configuration enables the tip housing 412 to act as a handle while the first electrical pins 446A and the second electrical pins 446B are inserted (e.g., pressed-fit) into a pair of first channels 448A and a pair of second channels 448B of the body 442 of the adaptor 440. However, in some examples, the first electrical pins 446A and the second electrical pins 446B are insert molded to the body 442, or the body 442 is molded to the first electrical pins 446A and the second electrical pins 446B. Additionally, the monolithic constructions of the tip housing 412 and the adaptor 440 reduces part count. The first electrical pins 446A and the second electrical pins 446B extend from a first adaptor-mounting surface 450 of the body 442 to a second adaptor-mounting surface 452 of the body 442. The adaptor 440 is positioned relative to the tip housing 412, via integrated wings 484, such that the first electrical pins 446A and the second electrical pins 446B can be electrically coupled to the solder balls of the electrical component 120, via a conventional SMT technique, and the mounting pads of the circuit board 110, via an end mounting technique, as described above.

Figure 21:
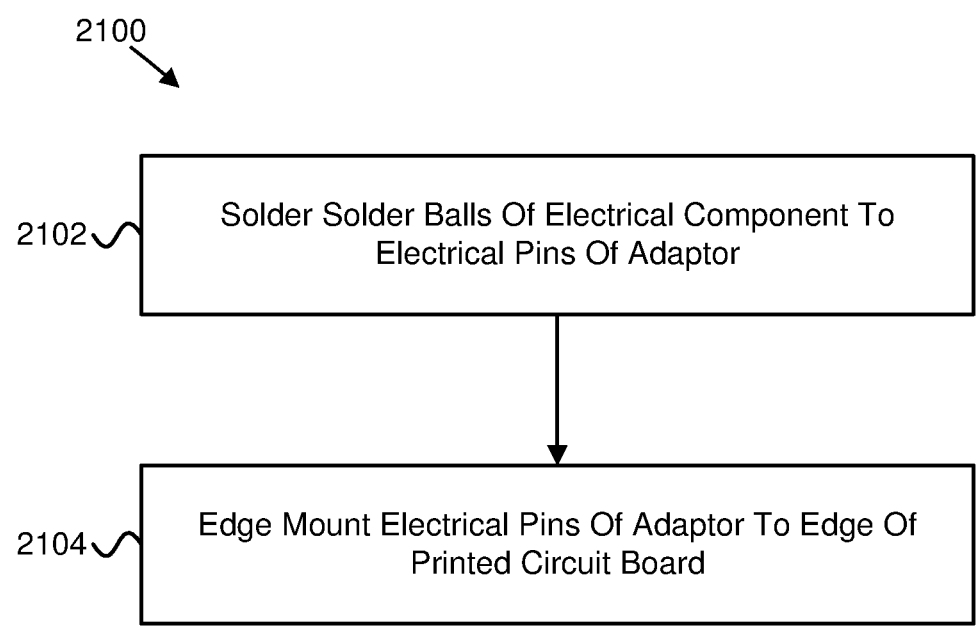
FIG. 21 is a flow diagram of a method of making an electrical device, according to one or more examples of the present disclosure.

Referring to FIG. 21, one example of a method 2100 for making an electrical device is illustrated. The method 2100 includes (block 2102) soldering solder balls of an electrical component to electrical pins of an adaptor. The method 2100 further includes (block 2104) edge mounting the electrical pins of the adaptor to an edge of a printed circuit board. The adaptor is edge mounted by electrically and mechanically attaching the electrical pins of the adaptor to at least one or more mounting surfaces on the printed circuit board where one or more of the mounting surfaces are opposing one another. One skilled in relevant art will recognize, however, that the order of the steps of method 2100 may be interchangeable.

Figure 22:
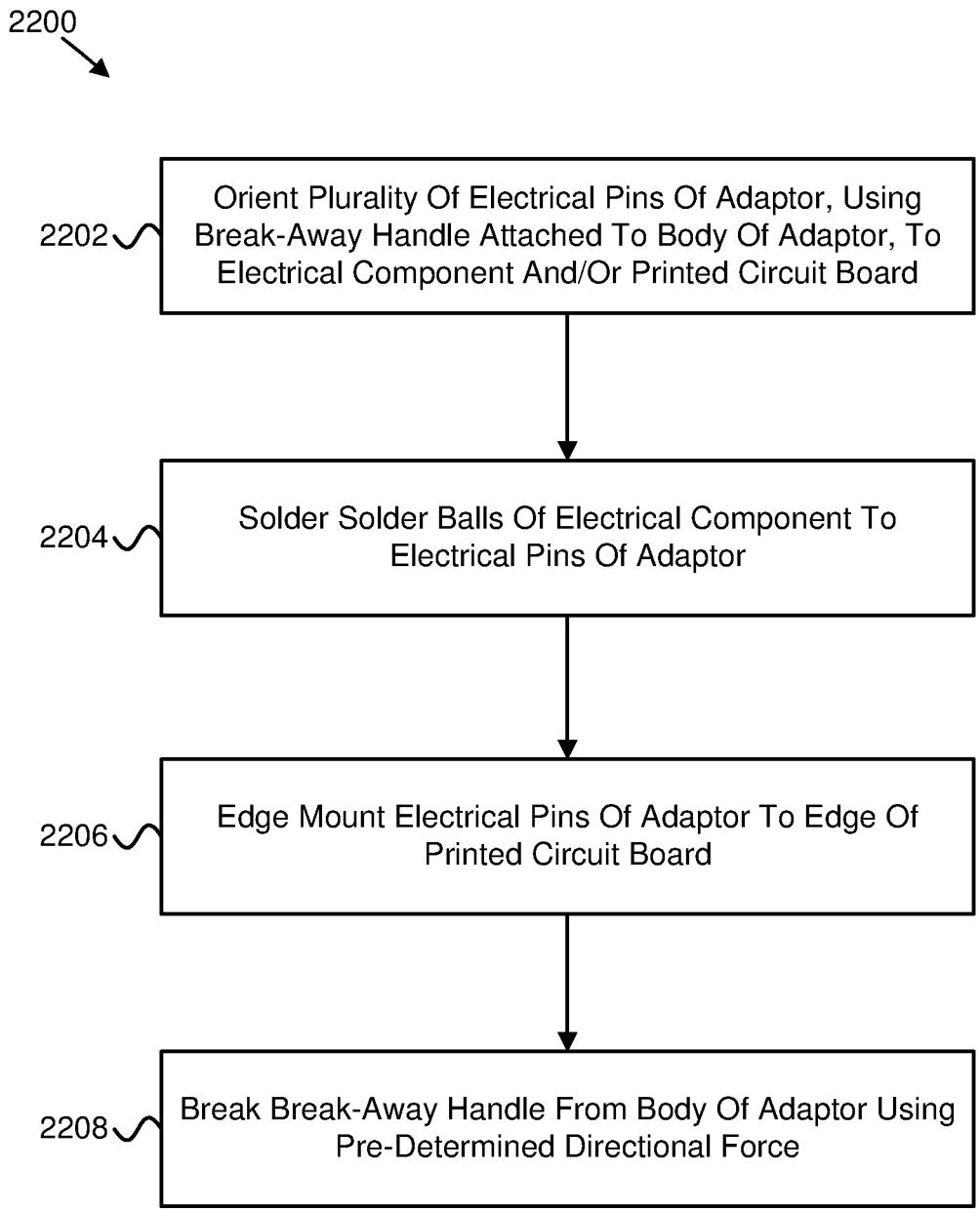
FIG. 22 is a flow diagram of a method of making an electrical device, according to one or more examples of the present disclosure.

Referring to FIG. 22, another example of a method 2200 for making an electrical device is depicted. The method 2200 includes (block 2202) orienting electrical pins of an adaptor to solder balls of an electrical component, and/or orienting the electrical pins of the adaptor to an edge of a printed circuit board using a break-away handle attached to the adaptor by a break-away interface. The method 2200 additionally includes (block 2204) soldering the solder balls of the electrical component to the electrical pins of the adaptor and (block 2206) edge mounting the electrical pins of the adaptor to the edge of the printed circuit board. The method 2200 also includes (block 2208) breaking the break-away handle from the body of the adaptor at the break-away interface. One skilled in relevant art will recognize that order of the steps of the method 2200 may be different than that shown in FIG. 22.

Examples described herein may include end mounting of any of various electrical components to an edge of a printed circuit board, via an adaptor, where the electrical component was originally designed for SMT mounting to a mounting surface of a printed circuit board.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two." Moreover, unless otherwise noted, as defined herein a plurality of particular features does not necessarily mean every particular feature of an entire set or class of the particular features.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. An electrical device comprising:
a printed circuit board, comprising a first mounting surface, a second mounting surface opposite the first mounting surface, a mounting edge perpendicular to the first mounting surface and the second mounting surface, and a plurality of mounting pads on at least one of the first mounting surface and the second mounting surface;
an electrical component, comprising a ball grid array, having spaced apart solder balls, on a component mounting surface of the electrical component that is perpendicular to the first mounting surface and the second mounting surface; and
an adaptor, interposed between the mounting edge of the printed circuit board and the component mounting surface of the electrical component and comprising a body, made of an electrically non-conductive material, and a plurality of electrical pins, made of an electrically conductive material and passing at least partially through the body of the adaptor,
wherein:
each one of the plurality of electrical pins comprises a first end comprising an electrical contact surface and a second end comprising an electrical contact surface;
the first end of each one of the plurality of electrical pins is electrically directly mounted to a corresponding one of the spaced apart solder balls; and
the second end of each one of the plurality of electrical pins is electrically directly mounted to a corresponding one of the plurality of mounting pads.

2. The electrical device according to claim 1, wherein:
the electrical device comprises an endoscope;
the electrical component comprises a camera;
the endoscope comprises a tip assembly, comprising a tip housing and the adaptor; and
the camera is positioned within the tip housing.

3. The electrical device according to claim 2, wherein the tip and the adaptor together form a one-piece monolithic construction.

4. The electrical device according to claim 1, wherein:
the adaptor is electrically and mechanically surface mounted to the electrical component; and
the adaptor is electrically and mechanically edge mounted to the printed circuit board.

5. The electrical device according to claim 1, wherein the plurality of electrical pins are substantially parallel relative to each other.

6. The electrical device according to claim 1, wherein:
the body of the adapter comprises an adaptor-mounting surface that faces the electrical component; and
the first ends of the plurality of electrical pins of the adaptor are flush with the adaptor-mounting surface of the body of the adaptor.

7. The electrical device according to claim 1, wherein:
the body of the adapter comprises an adaptor-mounting surface that faces the electrical component; and
the first ends of the plurality of electrical pins of the adaptor protrude from the adaptor-mounting surface of the body of the adaptor.

8. The electrical device according to claim 7, wherein the body of the adaptor further comprises one or more dividers that protrude from adaptor-mounting surface of the body of the adaptor and that separate each one of the first ends of the plurality of electrical pins from any other one of the first ends of the plurality of electrical pins.

9. The electrical device according to claim 1, wherein the electrical contact surfaces of the second ends of the plurality of electrical pins of the adaptor are co-planar and mounted to only one of the first mounting surface or the second mounting surface of the printed circuit board.

10. The electrical device according to claim 1, wherein:
the electrical contact surfaces of the second ends of a first two of the plurality of electrical pins of the adaptor are co-planar, relative to a first virtual plane, and mounted to only the first mounting surface of the printed circuit board;
the electrical contact surfaces of the second ends of a second two of the plurality of electrical pins of the adaptor are co-planar, relative to a second virtual plane, and mounted to only the second mounting surface of the printed circuit board;
the first virtual plane and the second virtual plane are parallel to each other; and
a distance between the first two of the plurality of electrical pins is different than a distance between the second two of the plurality of electrical pins.

11. The electrical device according to claim 1, wherein:
each one of the plurality of electrical pins comprises a 90-degree bend; and
the first ends and the second ends of each one of the electrical pins are separated by the 90-degree bend,
the electrical contact surfaces of the first ends of the plurality of electrical pins of the adaptor are co-planar; and
the electrical contact surfaces of the first ends are perpendicular relative to the electrical contact surfaces of the second ends.

12. The electrical device according to claim 1, wherein:
at least one of the plurality of mounting pads is on the first mounting surface;
at least one of the plurality of mounting pads is on the second mounting surface;
the second end of a first one or first ones of the of the plurality of electrical pins of the adaptor is mounted to a corresponding one of the at least one of the plurality of mounting pads on the first mounting surface; and
the second end of a second one or second ones of the of the plurality of electrical pins of the adaptor is mounted to a corresponding one of the at least one of the plurality of mounting pads on the second mounting surface.

13. The electrical device according to claim 12, wherein the printed circuit board further comprises a thickness and the first one or first ones of the plurality of electrical pins and the second one or second ones of the plurality of electrical pins are separated by a distance substantially equal to the thickness of the printed circuit board.

14. The electrical device according to claim 1, wherein:
the body of the adaptor further comprises a plurality of channels;
each one of the plurality of channels is circumferentially closed;
the plurality of channels are spaced apart from each other; and
each one of the plurality of electrical pins pass through a corresponding one of the plurality of channels.

15. The electrical device according to claim 1, wherein the body of the adaptor further comprises:
- a plurality of sides; and
- a protrusion protruding from a single one of the plurality of sides.

16. An endoscope, comprising:
- a tip assembly, comprising:
  - a tip housing; and
  - an adaptor, comprising a body, made of an electrically non-conductive material and forming a one-piece monolithic construction with the tip housing, and a plurality of electrical pins, made of an electrically conductive material and passing through the body of the adaptor,
- an imaging device housed by and in mating engagement with the tip housing, wherein the imaging device comprises a ball grid array electrically directly mounted to the plurality of electrical pins of the adaptor; and
- a printed circuit board electrically directly mounted to the plurality of electrical pins of the adaptor, wherein the adaptor is interposed between the printed circuit board and the imaging device.

17. The endoscope of claim 16, wherein:
- the tip assembly further comprises one or more wings coupling together the tip housing and the adaptor such that the adaptor is aligned with the tip housing and does not move relative to the tip housing; and
- the one or more wings form a one-piece monolithic construction with the tip housing and the adaptor.

18. A method of making an electrical device, the method comprising steps of:
- soldering a plurality of solder balls of an electrical component to a plurality of electrical pins of an adaptor, wherein the adaptor comprises a body, made of an electrically non-conductive material, and the electrical pins at least partially pass through the body; and
- edge mounting the adaptor to an edge of a printed circuit board, comprising mounting pads on at least one of two opposing mounting surfaces of the printed circuit board, by electrically mounting the electrical pins of the adapter onto the mounting pads of the printed circuit board, wherein the two opposing mounting surfaces of the printed circuit board are perpendicular relative to the edge of the printed circuit board.

19. The method of claim 18, further comprising steps of:
- prior to one or more of the steps of soldering the plurality of solder balls to the plurality of electrical pins and edge mounting the adaptor to the edge of the printed circuit board, orienting the plurality of electrical pins using a break-away handle attached to the body of the adaptor to one or more of the plurality of solder balls and the edge of the printed circuit board; and
- subsequent to the steps of soldering the plurality of solder balls to the plurality of electrical pins and edge mounting the adaptor to the edge of the printed circuit board, breaking the break-away handle from the body of the adaptor using a pre-determined directional force.

20. The method of claim 18, further comprising steps of, prior to the steps of soldering the plurality of solder balls to the plurality of electrical pins and edge mounting the adaptor to the edge of the printed circuit board:
- co-stamping a plurality of groups of electrical pins and one or more stamped strips, wherein second ends of the electrical pins are connected to the one or more stamped strips at break-away interfaces;
- co-forming a plurality of electrically non-conductive bodies around each group of electrical pins, wherein at least a portion of first ends of the electrical pins and the second ends of the electrical pins remain exposed; and
- breaking the groups of electrical pins away from the stamped strips at the break-away interfaces to form a plurality of adapters, wherein the adapter is one of the plurality of adapters.

* * * * *